(12) United States Patent
Chen et al.

(10) Patent No.: US 11,152,370 B2
(45) Date of Patent: Oct. 19, 2021

(54) MEMORY STRUCTURE HAVING TRANSISTORS AND CAPACITOR AND MANUFACTURING METHOD THEREOF

(71) Applicant: Powerchip Semiconductor Manufacturing Corporation, Hsinchu (TW)

(72) Inventors: Yu-An Chen, Hsinchu (TW); Shih-Siang Chen, Taichung (TW); Shih-Ping Lee, Hsinchu (TW); Yi-Nung Lin, New Taipei (TW); Po-Yi Wu, Hsinchu (TW); Chen-Tso Han, Taipei (TW); Bo-An Tsai, Hsinchu (TW)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 66 days.

(21) Appl. No.: 16/509,516

(22) Filed: Jul. 12, 2019

(65) Prior Publication Data
US 2020/0357801 A1  Nov. 12, 2020

(30) Foreign Application Priority Data
May 7, 2019   (TW) ................................. 108115698

(51) Int. Cl.
*H01L 27/108*  (2006.01)
*H01L 21/306*  (2006.01)
(Continued)

(52) U.S. Cl.
CPC ...... *H01L 27/10829* (2013.01); *H01L 21/308* (2013.01); *H01L 21/30604* (2013.01);
(Continued)

(58) Field of Classification Search
CPC ......... H01L 27/10832; H01L 27/10826; H01L 27/10858; H01L 27/10879; H01L 21/845;
(Continued)

(56) References Cited

U.S. PATENT DOCUMENTS 4,694,561 A * 9/1987 Lebowitz ............. H01L 29/945
                                              438/249
4,921,816 A * 5/1990 Ino .................... H01L 27/10829
                                              257/304
(Continued)

FOREIGN PATENT DOCUMENTS

TW   200729413   8/2007

OTHER PUBLICATIONS

Office Action of Taiwan Counterpart Application, dated Sep. 26, 2019, p. 1-p. 5.

*Primary Examiner* — Nelson Garces
(74) *Attorney, Agent, or Firm* — JCIPRNET

(57) ABSTRACT

A memory structure including first and second transistors, an isolation structure and a capacitor and a manufacturing method thereof are provided. The first and second transistors are disposed on the substrate. The isolation structure is disposed in the substrate between the first and second transistors. The capacitor is disposed between the first and second transistors. The capacitor includes a body portion and first and second extension portions. The first and second extensions are extended from the body portion into the substrate at two sides of the isolation structure and connected to the source/drain regions of the first and the second transistors, respectively. The widths of first and second extension portions are decreased downward from a top surface of the isolation structure.

18 Claims, 6 Drawing Sheets

(51) Int. Cl.
*H01L 21/308* (2006.01)
*H01L 21/762* (2006.01)

(52) U.S. Cl.
CPC .... *H01L 21/76224* (2013.01); *H01L 27/1087* (2013.01); *H01L 27/10873* (2013.01)

(58) Field of Classification Search
CPC . H01L 29/0649; H01L 29/04; H01L 27/1211; H01L 28/40; H01L 29/517; H01L 27/10829; H01L 27/10861; H01L 27/10867; H01L 21/02532; H01L 29/41783; H01L 21/823418; H01L 21/823814; H01L 21/76262; H01L 21/76278; H01L 21/76294; G06F 17/5068; G06F 17/5045
See application file for complete search history.

(56) References Cited

U.S. PATENT DOCUMENTS

| | | | |
|---|---|---|---|
| 5,106,774 A | * | 4/1992 | Hieda ............... H01L 27/10861 438/246 |
| 8,890,227 B1 | | 11/2014 | Chen et al. |
| 2017/0278953 A1 | | 9/2017 | Yang et al. |

\* cited by examiner

MEMORY STRUCTURE HAVING TRANSISTORS AND CAPACITOR AND MANUFACTURING METHOD THEREOF

CROSS-REFERENCE TO RELATED APPLICATION

This application claims the priority benefit of Taiwan application serial no. 108115698, filed on May 7, 2019. The entirety of the above-mentioned patent application is hereby incorporated by reference herein and made a part of this specification.

BACKGROUND

Technical Field

The present invention relates to a semiconductor structure and a manufacturing method thereof, and more particularly to a memory structure and a manufacturing method thereof.

Description of Related Art

A memory structure including a transistor and a capacitor has been developed. In such memory structure, the capacitor is used as a storage device. Under the current trend of increasing the integration of devices, how to effectively improve the electrical performance of the memory device without increasing the size of the memory cell is the current goal of the industry.

SUMMARY

The present invention provides a memory structure, wherein the extension portion of the capacitor extends from the body portion into the substrate at both sides of the isolation structure.

The present invention provides a manufacturing method of a memory structure for manufacturing the above memory structure.

A memory structure of the present invention includes a first transistor and a second transistor, an isolation structure, and a capacitor. The first transistor and the second transistor are disposed on a substrate. The isolation structure is disposed in the substrate between the first transistor and the second transistor. The capacitor is disposed between the first transistor and the second transistor. The capacitor includes a body portion, a first extension portion and a second extension portion. The body portion is disposed above the isolation structure. The first extension portion is extended from the body portion into the substrate at one side of the isolation structure and connected to a source/drain region of the first transistor. The second extension portion is extended from the body portion into the substrate at another side of the isolation structure and connected to a source/drain region of the second transistor. A width of the first extension portion and a width of the second extension portion are decreased downward from a top surface of the isolation structure.

In an embodiment of the memory structure of the present invention, the first transistor is one of an N-type metal oxide semiconductor (NMOS) transistor and a P-type metal oxide semiconductor (PMOS) transistor, and the second transistor is the other of the NMOS transistor and the PMOS transistor.

In an embodiment of the memory structure of the present invention, the first extension portion is in contact with a sidewall of the isolation structure.

In an embodiment of the memory structure of the present invention, the first extension portion is not in contact with a sidewall of the isolation structure.

In an embodiment of the memory structure of the present invention, the second extension portion is in contact with a sidewall of the isolation structure.

In an embodiment of the memory structure of the present invention, the second extension portion is not in contact with a sidewall of the isolation structure.

In an embodiment of the memory structure of the present invention, the capacitor includes a bottom electrode, a top electrode and an insulation layer between the bottom electrode and the top electrode, and each of the body portion, the first extension portion and the second extension portion includes a part of the bottom electrode, a part of the top electrode and a part of the insulation layer.

In an embodiment of the memory structure of the present invention, the bottom electrode of the first extension portion is connected to the source/drain region of the first transistor.

In an embodiment of the memory structure of the present invention, the bottom electrode of the second extension portion is connected to the source/drain region of the second transistor.

In an embodiment of the memory structure of the present invention, the memory structure further includes a protection layer disposed on sidewalls of a gate structure of the first transistor and sidewalls of a gate structure of the second transistor.

A manufacturing method of the memory structure of the present invention includes the following steps: forming an isolation structure in a substrate; forming a first transistor and a second transistor on the substrate, wherein the first transistor and the second transistor are respectively located at both sides of the isolation structure; and forming a capacitor between the first transistor and the second transistor. The capacitor includes a body portion, a first extension portion and a second extension portion. The body portion is disposed above the isolation structure. The first extension portion is extended from the body portion into the substrate at one side of the isolation structure and connected to a source/drain region of the first transistor. The second extension portion is extended from the body portion into the substrate at another side of the isolation structure and connected to a source/drain region of the second transistor. A width of the first extension portion and a width of the second extension portion are decreased downward from a top surface of the isolation structure.

In an embodiment of the manufacturing method of the present invention, a method for forming the capacitor includes the following steps: forming a first trench and a second trench respectively in the substrate at both sides of the isolation structure, wherein a width of the first trench and a width of the second trench are decreased downward from the top surface of the isolation structure; forming a dielectric layer on the substrate, wherein the dielectric layer covers a first gate structure of the first transistor and a second gate structure of the second transistor and fills the first trench and the second trench; forming a third trench in the dielectric layer, wherein the third trench exposes the isolation structure, the first trench, the second trench and at least a part of the source/drain region of the first transistor and at least a part of the source/drain region of the second transistor respectively located at both sides of the isolation structure; forming a bottom electrode on a sidewall and a bottom surface of the first trench, a sidewall and a bottom surface of the second trench, a sidewall and a bottom surface of the third trench and an exposed surface of the isolation structure; forming an insulation layer on the bottom electrode; and forming a top electrode on the insulation layer.

In an embodiment of the manufacturing method of the present invention, the substrate is a silicon substrate, a top surface of the substrate is a {100} plane, and a method for forming the first trench and the second trench includes the following steps: forming a patterned mask layer on the substrate, wherein the patterned mask layer exposes a region comprising the isolation structure and the substrate at both sides of the isolation structure; and performing a wet etching process to remove a part of the substrate at both sides of the isolation structure. A surface of the substrate exposed by the first trench is a {111} plane, and a surface of the substrate exposed by the second trench is a {111} plane. An angle between the surface of the substrate exposed by the first trench and the top surface of the substrate is between 50 degrees and 60 degrees, and an angle between the surface of the substrate exposed by the second trench and the top surface of the substrate is between 50 degrees and 60 degrees.

In an embodiment of the manufacturing method of the present invention, an etchant used in the wet etching process comprises KOH, tetramethyl ammonium hydroxide or ethylene diamine pyrochatecol.

In an embodiment of the manufacturing method of the present invention, a method for forming the first transistor and the second transistor includes the following steps: forming a first gate structure and a second gate structure on the substrate before forming the first trench and the second trench; and forming the source/drain region of the first transistor in the substrate beside the first gate structure, and forming the source/drain region of the second transistor in the substrate beside the second gate structure after forming the first trench and the second trench.

In an embodiment of the manufacturing method of the present invention, the method further includes the following steps: forming a protection layer conformally on the substrate before forming the first trench and the second trench; and removing a part of the protection layer to retain the protection layer on the sidewall of the gate structure of the first transistor and the sidewall of the gate structure of the second transistor after forming the first trench and the second trench and before forming the dielectric layer.

In an embodiment of the manufacturing method of the present invention, the first extension portion is in contact with a sidewall of the isolation structure.

In an embodiment of the manufacturing method of the present invention, the first extension portion is not in contact with a sidewall of the isolation structure.

In an embodiment of the manufacturing method of the present invention, the second extension portion is in contact with a sidewall of the isolation structure.

In an embodiment of the manufacturing method of the present invention, the second extension portion is not in contact with a sidewall of the isolation structure.

Based on the above, in the memory structure of the present invention, the capacitor is disposed between the two transistors, and the extension portions of the capacitor are extended from the body portion into the substrate at both sides of the isolation structure, so that the coupling ratio (or coupling area) between the bottom electrode and the top electrode can be increased without increasing the layout area, thereby improving the performance of the memory structure. Further, in the manufacturing method of the memory structure of the present invention, a surface of the substrate belonging to the {111} plane is used as a stop surface in the wet etching process, so that a trench with a width decreasing downward from a top surface of the isolation structure can be naturally formed after the wet etching process is performed, and a depth of the trench can be controlled without controlling the etching time.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1A:
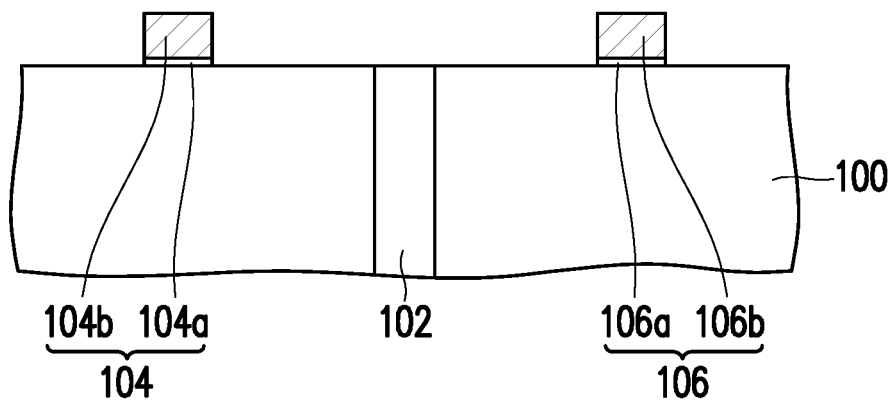
FIGS. 1A to 1F are schematic cross-sectional views showing a manufacturing process of a memory structure in accordance with a first embodiment of the present invention.

The embodiments are described in detail below with reference to the accompanying drawings, but the embodiments are not intended to limit the scope of The present invention. In addition, the drawings are for illustrative purposes only and are not drawn to the original dimensions. For the sake of easy understanding, the same elements in the following description will be denoted by the same reference numerals.

In addition, the terms mentioned in the text, such as "comprising", "including" and "having" are all open-ended terms, i.e., meaning "including but not limited to".

In addition, the directional terms mentioned in the text, such as "on" and "under", are merely used to refer to the drawings and are not intended to limit the present invention.

FIGS. 1A to 1F are schematic cross-sectional views showing a manufacturing process of a memory structure in accordance with a first embodiment of the present invention.

Referring to FIG. 1A, a substrate 100 is provided. In the present embodiment, the substrate 100 is, for example, a silicon substrate, and a top surface of the substrate 100 is a {100} plane. An isolation structure 102 is then formed in the substrate 100 to define an active area (AA). The isolation structure 102 is, for example, a shallow trench isolation (STI) structure. The method for forming the isolation structure 102 is well known to those skilled in the art and will not be described herein. Next, a gate structure 104 and a gate structure 106 are formed on the substrate 100. The gate structure 104 and the gate structure 106 are separated from each other by the isolation structure 102. In the present embodiment, the gate structure 104 includes a gate dielectric layer 104a and a gate 104b sequentially disposed on the substrate 100, and the gate structure 106 includes a gate dielectric layer 106a and a gate 106b sequentially disposed on the substrate 100. The method for forming the gate structure 104 and the gate structure 106 is well known to those skilled in the art and will not be described herein.

Figure 1B:
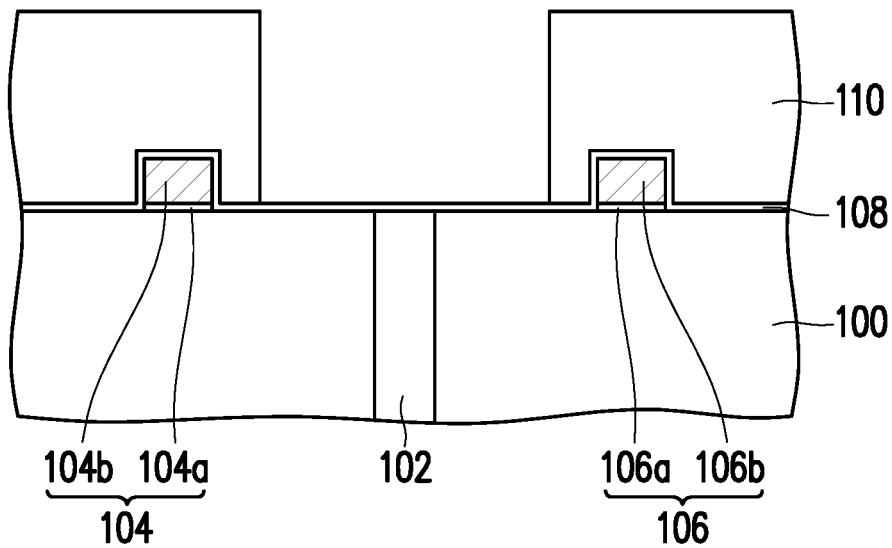

Then, referring to FIG. 1B, a protection layer 108 is conformally formed on the substrate 100. The protection layer 108 is, for example, a silicon nitride layer. The protection layer 108 is used to protect the substrate 100 and the gate structure 104 and the gate structure 106 formed on the substrate 100 in a subsequent etching process. Thereafter, a patterned mask layer 110 is formed on the protection layer 108. The patterned mask layer 110 is, for example, a patterned photoresist layer. The patterned mask layer 110 exposes a region including the isolation structure 102 and the substrate 100 at both sides of the isolation structure 102.

Figure 1C:
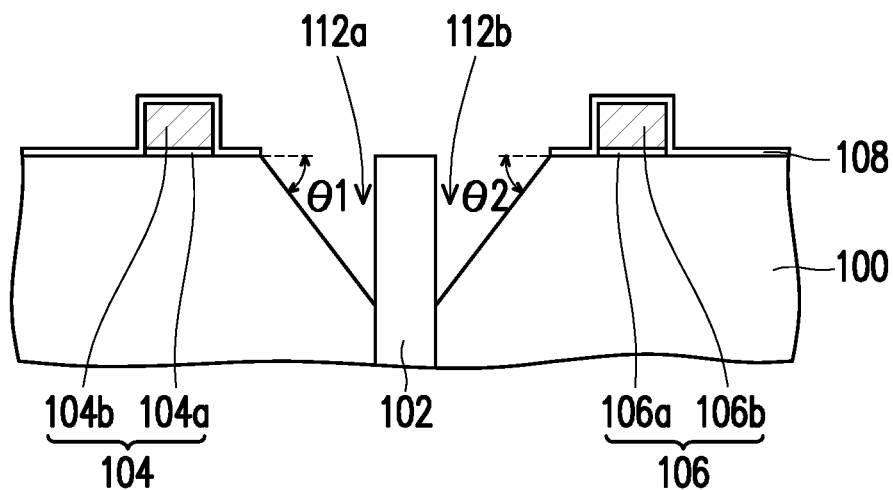

Next, referring to FIG. 1C, an anisotropic etching process is performed using the patterned mask layer 110 as an etching mask, and the exposed protection layer 108 is removed to expose the isolation structure 102 and the substrate 100 at both sides of the isolation structure 102. Then, the patterned mask layer 110 is removed. In the present embodiment, after the anisotropic etching process is performed, the protection layer 108 remaining on the substrate 100 can be used as a patterned mask layer in the subsequent etching process. Then, the protecting layer 108, which is retained on the substrate 100, is used as an etching mask to perform a wet etching process, and a part of the substrate 100 at both sides of the isolation structure 102 is removed to form a trench 112a and a trench 112b respectively in the substrate 100 at both sides of the isolation structure 102. In the present embodiment, the formed trench 112a and trench 112b expose the sidewall of the isolation structure 102. In addition, a width of the trench 112a and a width of the trench 112b are decreased downward from a top surface of the isolation structure 102, that is, the cross-sectional shape of the trench 112a and the trench 112b is substantially an inverted triangle.

In the present embodiment, the substrate 100 is a silicon substrate, and a top surface of the substrate 100 is a {100} plane. Since the etching rate of the {111} plane of silicon is much lower than the etching rate of other kinds of planes of silicon, in the wet etching process for the substrate 100, the exposed plane belonging to the {111} plane can be used as a stop surface in the wet etching process. That is to say, after the wet etching process, the surface of the substrate 100 exposed by the trench 112a is the {111} plane, and the surface of the substrate 100 exposed by the trench 112b is the {111} plane. Based on the above, the angle θ1 between the surface of the substrate 100 exposed by the trench 112a and the top surface of the substrate 100 may be between 50 degrees and 60 degrees, and the angle θ2 between the surface of the substrate 100 exposed by the trench 112b and the top surface of the substrate 100 may be between 50 degrees and 60 degrees. In addition, the isolation structure 102 is also used as a stop layer in the wet etching process. As a result, after the wet etching process, the trench 112a and the trench 112b with a width decreased downward from the top surface of the isolation structure 102 are naturally formed. In the present embodiment, the etchant used in the wet etching process is, for example, KOH, tetramethyl ammonium hydroxide or ethylene diamine pyrochatecol. In the present embodiment, the {111} plane is used as the stop surface in the wet etching process, so that a depth of the trench 112a and a depth of the trench 112b can be controlled without specifically controlling the timing of the etching process.

Figure 1D:
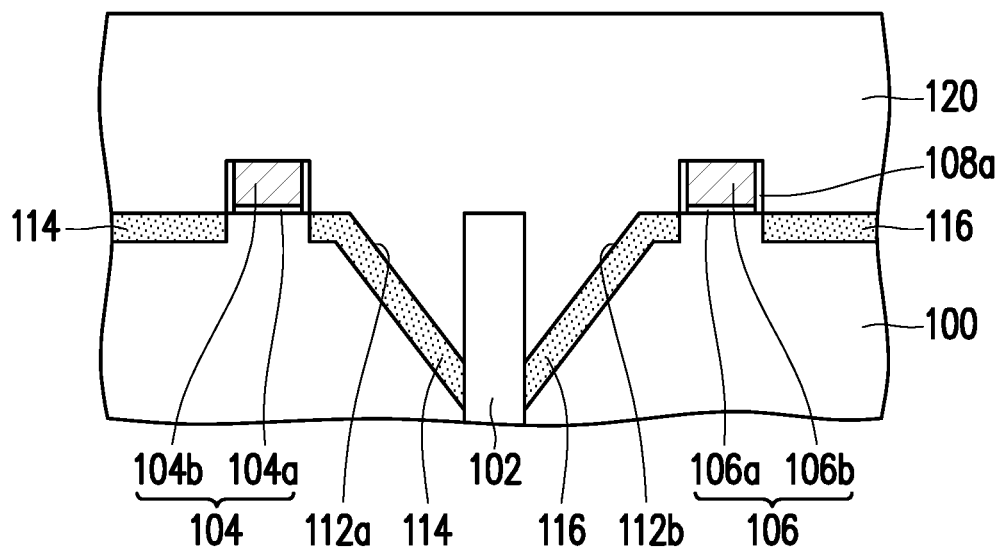

Then, referring to FIG. 1D, an anisotropic etching process is performed to remove a part of the protection layer 108 to form a protection layer 108a on the sidewall of the gate structure 104 and on the sidewall of the gate structure 106. The protection layer 108a is used as a spacer disposed on the sidewall of the gate structure 104 and on the sidewall the gate structure 106. Next, an ion implantation process is performed by using the gate structure 104, the gate structure 106 and the protection layer 108a as a mask to form a doped region 114 in the substrate 100 beside the gate structure 104 and to form a doped region 116 in the substrate 100 beside the gate structure 106. The detailed method for forming the doped region 114 and doped region 116 is well known to those skilled in the art and will not be described herein. In the present embodiment, since the trench 112a and the trench 112b expose the sidewall of the isolation structure 102, the formed doped region 114 is only located in the substrate 100 exposed by the trench 112a, and the formed doped region 116 is located only in the substrate 100 exposed by the trench 112b. Then, a dielectric layer 120 is formed on the substrate 100. The dielectric layer 120 covers the substrate 100 and the elements formed on the substrate 100 and fills the trench 112a and the trench 112b. The dielectric layer 120 is, for example, a silicon oxide layer. The dielectric layer 120 is generally referred to as an inter-layer dielectric layer.

In the present embodiment, the gate structure 104 and the doped region 114 constitute a transistor 118a, and the gate structure 106 and the doped region 116 constitute a transistor 118b. The doped region 114 has a different conductivity type from the doped region 116. For example, the doped region 114 has an N-type dopant therein such that the transistor 118a is an NMOS transistor, and the doped region 116 has a P-type dopant therein such that the transistor 118b is a PMOS transistor. Conversely, transistor 118a is a PMOS transistor and transistor 118b is an NMOS transistor.

Figure 1E:
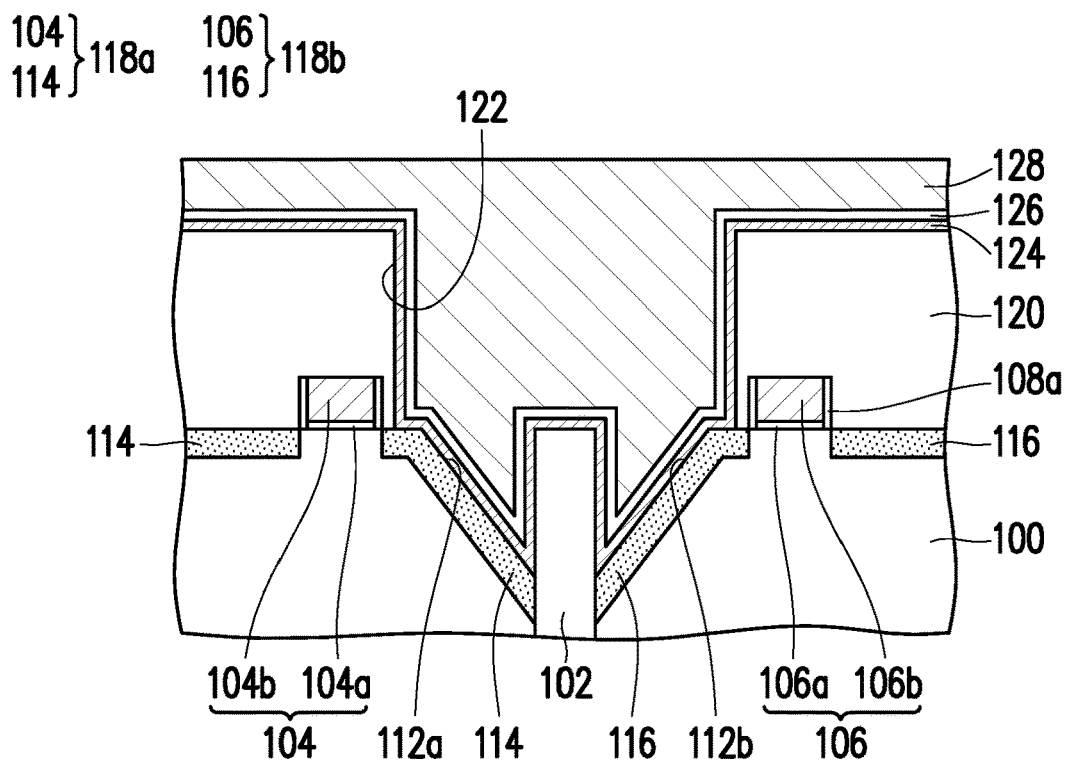

Next, referring to FIG. 1E, a trench 122 is formed in the dielectric layer 120. The trench 122 exposes the isolation structure 102, the trench 112a, the trench 112b, and at least a part of the doped region 114 and at least a part of the doped region 116 respectively located at both sides of the isolation structure 102. The trench 122 is formed by, for example, forming a patterned mask layer (not shown) on the dielectric layer 120, and then performing an anisotropic etching process to remove a part of the dielectric layer 120. Then, a conductive layer 124 for forming a bottom electrode of a capacitor is formed conformally on the substrate 100, that is, the conductive layer 124 is formed on the sidewall and the bottom surface of the trench 112a, the sidewall and the bottom surface of the trench 112b, the sidewall and the bottom surface of the trench 122 and the exposed surface of the isolation structure 102. The conductive layer 124 is, for example, a titanium nitride layer or a composite layer composed of a titanium layer and a titanium nitride layer. Next, a dielectric layer 126 for forming an insulation layer of the capacitor is conformally formed on the conductive layer 124. The dielectric layer 126 is, for example, a high dielectric constant (high-K) layer. Thereafter, a conductive layer 128 for forming a top electrode of the capacitor is formed on the dielectric layer 126. The conductive layer 128 fills the trench 112a, the trench 112b, and the trench 122. The conductive layer 128 is, for example, a composite layer composed of a tungsten layer or a tungsten layer and a titanium nitride layer.

Figure 1F:
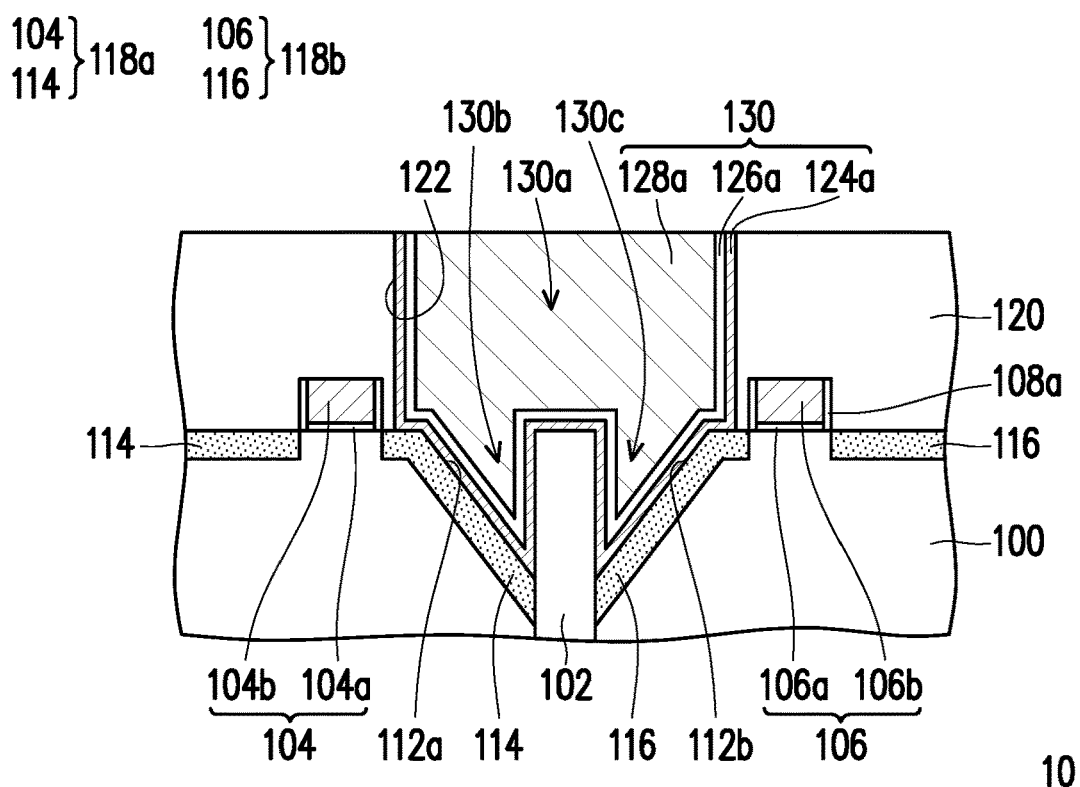

Thereafter, referring to FIG. 1F, a planarization process is performed to remove a part of the conductive layer 124, a part of the dielectric layer 126, and a part of the conductive layer 128 until the top surface of the dielectric layer 120 is exposed. The above planarization process is, for example, a chemical mechanical polishing (CMP) process. After the planarization process, a capacitor 130 is formed, which includes a bottom electrode 124a, an insulation layer 126a, and a top electrode 128a, that is, the capacitor 130 belongs to a well-known metal-insulation layer-metal (MIM) capacitor. In this way, a memory structure 10 of the present embodiment is completed. In addition, a contact connected to the transistor 118a, a contact connected to the transistor 118b, a contact connected to the top electrode 128a of the capacitor 130, etc., which are well known to those skilled in the art, may be formed in the subsequent process.

In the present embodiment, the planarization process is performed after forming the conductive layer 124, the insulation layer 126, and the conductive layer 128 to complete the fabrication of the capacitor, but the invention is not limited thereto. In other embodiments, the process steps described above may be changed as the case may be.

In the present embodiment, the memory structure 10 includes a substrate 100, an isolation structure 102, a transistor 118a, a transistor 118b, and a capacitor 130. The capacitor 130 is disposed between the transistor 118a and the transistor 118b. The capacitor 130 is includes a bottom electrode 124a, an insulation layer 126a and a top electrode 128a, wherein the insulation layer 126a is located between the bottom electrode 124a and the top electrode 128a. Further, the capacitor 130 includes a body portion 130a, an extension portion 130b, and an extension portion 130c, wherein each of the body portion 130a, the extension portion 130b, and the extension portion 130c includes a part of the bottom electrode 124a, a part of the insulation layer 126a, and a part of the top electrode 128a. As shown in FIG. 1F, the body portion 130a is disposed above the isolation structure 102, and the extension portion 130b is extended from the body portion 130a into the substrate 100 at one side of the isolation structure 102 and connected to the source/drain region of the transistor 118a (the doped region 114 under the trench 112a), and the extension portion 130c is extended from the body portion 130a into the substrate 100 at another side of the isolation structure 102 and connected to the source/drain region of the transistor 118b (the doped region 116 under the trench 112b).

In the present embodiment, the width of the extension portion 130b and the width of the extension portion 130c are decreased downward from the top surface of the isolation structure 102, that is, the cross-sectional shape of the extension portion 130b and the extension portion 130c is substantially inverted triangles. Further, the extension portion 130b and the extension portion 130c are in contact with the sidewall of the isolation structure 102, respectively.

In the memory structure 10, the extension portion 130b and the extension portion 130c of the capacitor 130 are extended downward into the substrate 100 at both sides of the isolation structure 102, so that the coupling ratio (or coupling area) between the bottom electrode 124a and the top electrode 128a can be increased without increasing the layout area and increasing the thickness of the memory structure, thereby improving the performance of the memory structure.

FIGS. 2A to 2E are schematic cross-sectional views showing a manufacturing process of a memory structure in accordance with a second embodiment of the present invention. In the present embodiment, the same elements as those of the first embodiment will be denoted by the same reference numerals and will not be described again.

Figure 2A:
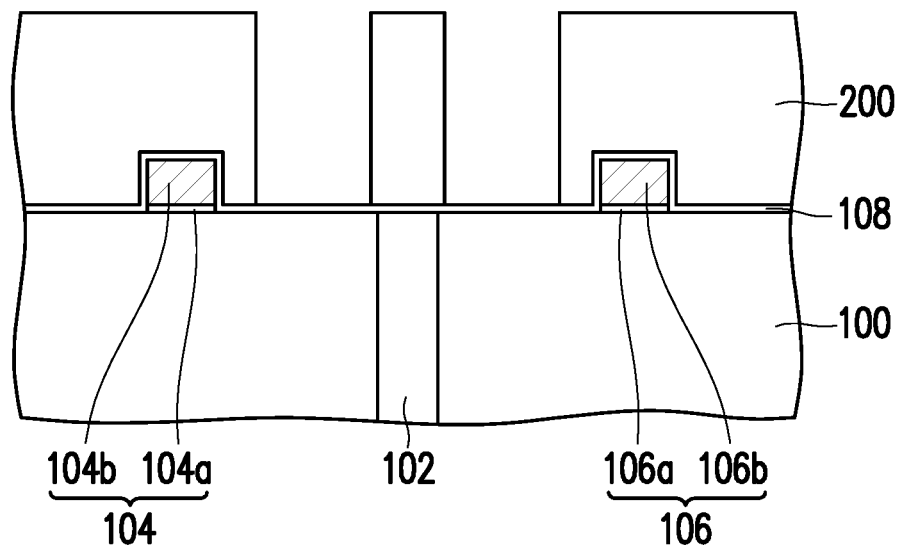
FIGS. 2A to 2E are schematic cross-sectional views showing a manufacturing process of a memory structure in accordance with a second embodiment of the present invention.

First, referring to FIG. 2A, after the protection layer 108 in FIG. 1B is formed, a patterned mask layer 200 is formed. The patterned mask layer 200 is, for example, a patterned photoresist layer. In the present embodiment, the patterned mask layer 200 covers the isolation structure 102 and a portion of substrate 100 at two sides of the isolation structure 102, and exposes the region between the isolation structure 102 and the gate structures 104 and 106.

Figure 2B:
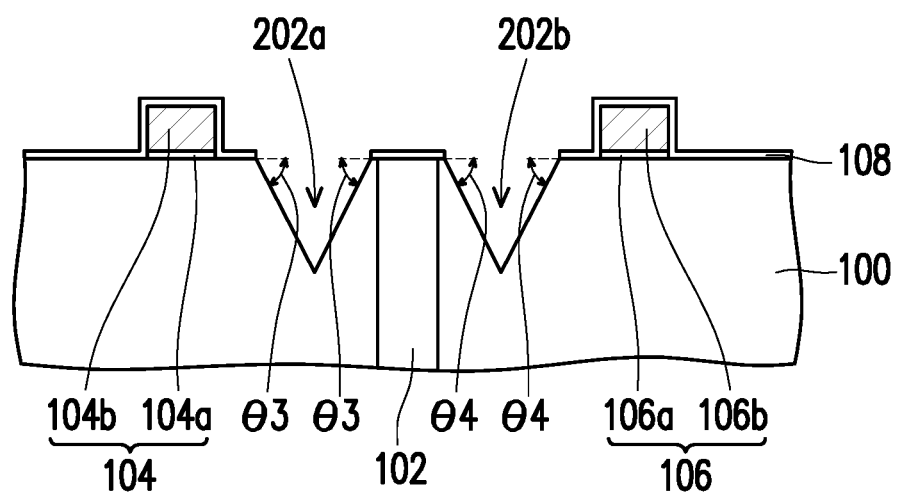

Then, referring to FIG. 2B, an anisotropic etching process is performed by using the patterned mask layer 200 as an etching mask, and a part of the protection layer 108 is removed to expose the substrate 100 between the isolation structure 102 and the gate structure 104, and between the isolation structure 102 and the gate structure 106. Then, the patterned mask layer 200 is removed. In the present embodiment, after the anisotropic etching process, the protection layer 108 remaining on the substrate 100 can be used as a patterned mask layer in the subsequent etching process. Further, in the present embodiment, the protection layer 108 covers the isolation structure 102 and the substrate 100 at both sides of the isolation structure 102. Then, using the protection layer 108 retained on the substrate 100 as an etching mask, a wet etching process is performed to remove a part of the substrate 100 between the isolation structure 102 and the gate structures 104 and 106 to form a trench 202a and a trench 202b in the substrate 100 at both sides of the isolation structure 102, respectively. In the present embodiment, the formed trench 202a and trench 202b do not expose the sidewall of the isolation structure 102. The width of the trench 202a and the trench 202b are decreased downward from the top surface of the isolation structure 102, that is, the cross-sectional shape of the trench 202a and the trench 202b is substantially an inverted triangle.

In the present embodiment, the substrate 100 is a silicon substrate, and the top surface of the substrate 100 is a {100} plane. Since the etching rate of the {111} plane of silicon is much lower than the etching rate of other kinds of planes of silicon, in the wet etching process for the substrate 100, the exposed plane belonging to the {111} plane can be used as the stop surface in the wet etching process. That is to say, after the wet etching process, the surface of the substrate 100 exposed by the trench 202a is the {111} plane, and the surface of the substrate 100 exposed by the trench 202b is the {111} plane. Based on the above, the angle θ3 between the surface of the substrate 100 exposed by the trench 202a and the top surface of the substrate 100 may be between 50 degrees and 60 degrees, and the angle θ4 between the surface of the substrate 100 exposed by the trench 202b and the top surface of the substrate 100 may be between 50 degrees and 60 degrees. In this way, after the wet etching process, the trench 202a and the trench 202b with a width decreased downward from the top surface of the isolation structure 102 are naturally formed. In the present embodiment, the etchant used in the wet etching process is, for example, KOH, tetramethyl ammonium hydroxide or ethylene diamine pyrochatecol. In the present embodiment, the {111} plane is used as the stop surface in the wet etching process, so that a depth of the trench 202a and a depth of the trench 202b can be controlled without specifically controlling the timing of the etching process.

Figure 2C:
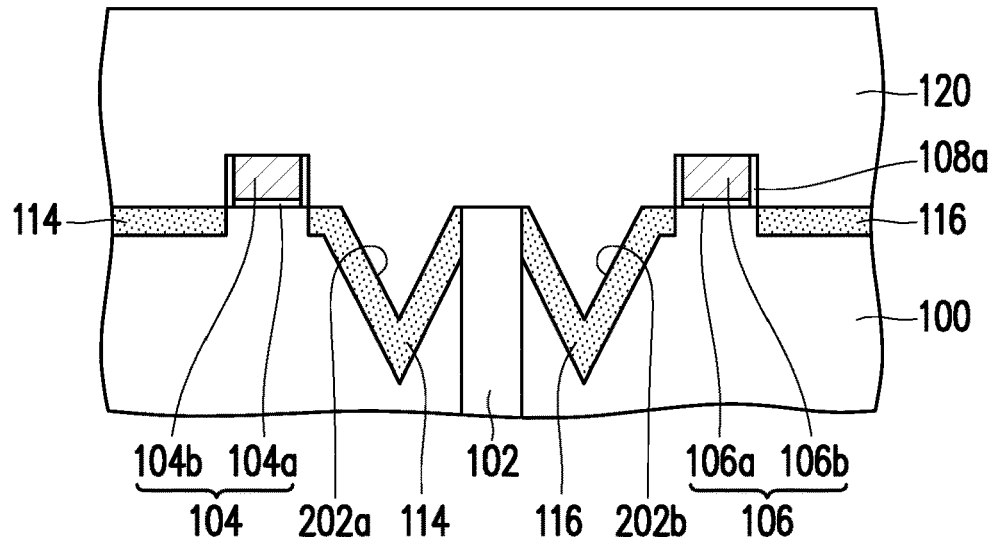

Next, referring to FIG. 2C, an anisotropic etching process is performed to remove a part of the protective layer 108 to form a protection layer 108a on the sidewall of the gate structure 104 and the sidewall of the gate structure 106. The protection layer 108a is used as a spacer disposed on the sidewall of the gate structure 104 and on the sidewall the gate structure 106. Next, an ion implantation process is performed by using the gate structure 104, the gate structure 106 and the protection layer 108a as a mask to form a doped region 114 in the substrate 100 beside the gate structure 104 and to form a doped region 116 in the substrate 100 beside the gate structure 106 The detailed formation for forming the doped region 114 and the doped region 116 is well known to those skilled in the art and will not be described herein. In the present embodiment, since the trench 202a and the trench 202b do not expose the sidewall of the isolation structure 102, the formed doped region 114 is located in the whole sidewall of the trench 202a, and the formed doped region 116 is located in the whole sidewall of the trench 202b. Then, a dielectric layer 120 is formed on the substrate 100. The dielectric layer 120 covers the substrate 100 and the elements formed on the substrate 100 and fills the trench 202a and the trench 202b.

In the present embodiment, the gate structure 104 and the doped region 114 constitute a transistor 118a, and the gate structure 106 and the doped region 116 constitute a transistor 118b.

Figure 2D:
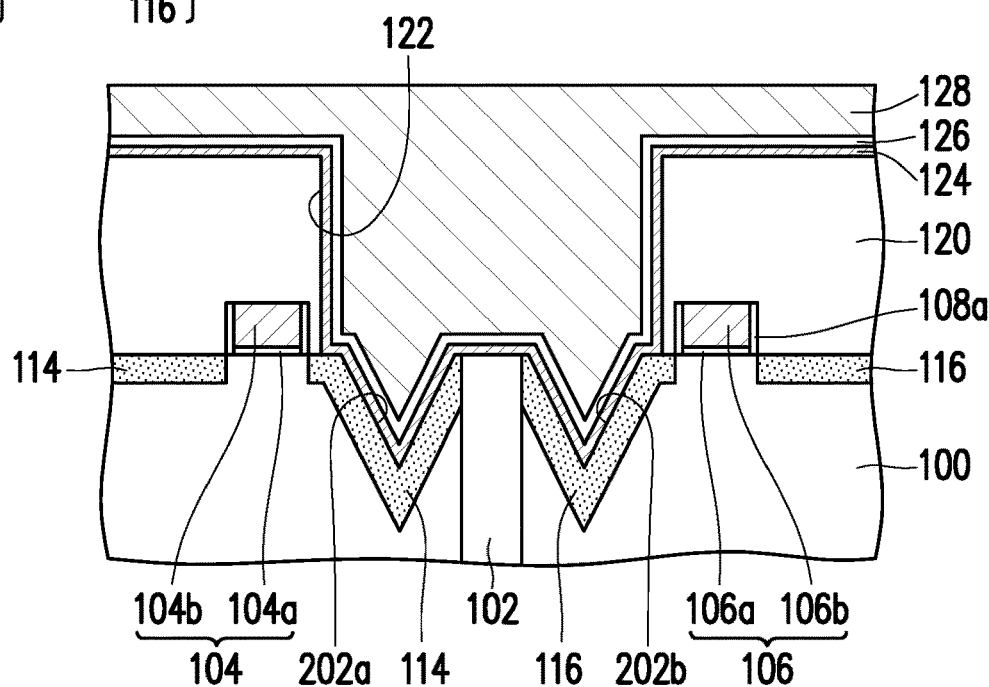

Then, referring to FIG. 2D, a trench 122 is formed in the dielectric layer 120. The trench 122 exposes the isolation structure 102, the trench 202a, the trench 202b, and at least a part of the doped region 114 and at least a part of the doped region 116 respectively located at both sides of the isolation structure 102. Then, a conductive layer 124 for forming a bottom electrode of a capacitor is formed conformally on the substrate 100, that is, the conductive layer 124 is formed on the sidewall and the bottom surface of the trench 202a, the sidewall and the bottom surface of the trench 202b, the sidewall and the bottom surface of the trench 122 and the exposed surface of the isolation structure 102. Next, a dielectric layer 126 for forming an insulation layer of the capacitor is conformally formed on the conductive layer 124. Thereafter, a conductive layer 128 for forming a top electrode of the capacitor is formed on the dielectric layer 126. The conductive layer 128 fills the trench 202a, the trench 202b, and the trench 122.

Figure 2E:
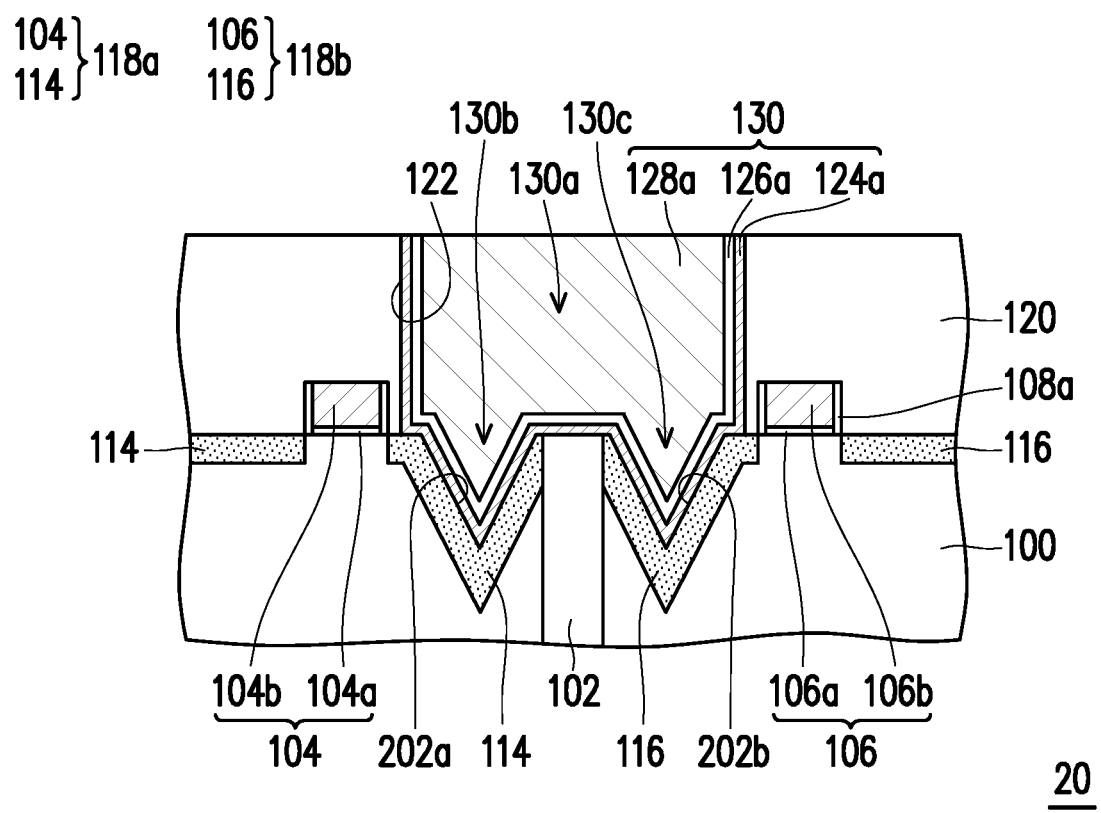

Thereafter, referring to FIG. 2E, a planarization process is performed to remove a part of the conductive layer 124, a part of the dielectric layer 126, and a part of the conductive layer 128 until the top surface of the dielectric layer 120 is exposed. After the planarization process, a capacitor 130 is formed, which includes a bottom electrode 124a, an insulation layer 126a, and a top electrode 128a, that is, the capacitor 130 belongs to a well-known MIM capacitor. In this way, a memory structure 20 of the present embodiment is completed. In addition, a contact connected to the transistor 118a, a contact connected to the transistor 118b, a contact connected to the top electrode 128a of the capacitor 130, etc., which are well known to those skilled in the art, may be formed in the subsequent process.

In the present embodiment, the planarization process is performed after the formation of the conductive layer 124, the insulation layer 126, and the conductive layer 128 to complete the fabrication of the capacitor, but the invention is not limited thereto. In other embodiments, the process steps described above may be changed as the case may be.

The difference between the memory structure 20 of the present embodiment and the memory structure 10 of the first embodiment is that the extension portion 130b and the extension portion 130c in the memory structure 10 are in contact with the sidewall of the isolation structure 102, respectively, but the extension portion 130b and the extension portion 130c in the memory structure 20 are not in contact with the sidewall of the isolation structure 102, that is, are separated from the isolation structure 102.

In the memory structure 20, the extension portion 130b and the extension portion 130c of the capacitor 130 are extended downward into the substrate 100 at both sides of the isolation structure 102, so that the coupling ratio (or coupling area) between the bottom electrode 124a and the top electrode 128a can be increased without increasing the layout area and increasing the thickness of the memory structure, thereby improving the performance of the memory structure.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A memory structure, comprising:
   a first transistor and a second transistor, disposed on a substrate;
   an isolation structure, disposed in the substrate between the first transistor and the second transistor;
   a first trench and a second trench, respectively disposed in the substrate at both sides of the isolation structure; and
   a capacitor, disposed between the first transistor and the second transistor, and comprising:
     a bottom electrode;
     a top electrode;
     an insulation layer between the bottom electrode and the top electrode;
     a body portion, disposed above the isolation structure;
     a first extension portion, extending from the body portion into the substrate at one side of the isolation structure and connected to a source/drain region of the first transistor; and
     a second extension portion, extending from the body portion into the substrate at another side of the isolation structure and connected to a source/drain region of the second transistor,
   wherein each of the body portion, the first extension portion and the second extension portion comprises a part of the bottom electrode, a part of the top electrode and a part of the insulation layer,
   wherein a width of the first extension portion and a width of the second extension portion are decreased downward from a top surface of the isolation structure,
   wherein the first transistor comprises a first doped region disposed in the first trench and between the substrate and the first extension portion, and the second transistor comprises a second doped region disposed in the second trench and between the substrate and the second extension portion.

2. The memory structure of claim 1, wherein the first transistor is one of an N-type metal oxide semiconductor (NMOS) transistor and a P-type metal oxide semiconductor (PMOS) transistor, and the second transistor is the other of the NMOS transistor and the PMOS transistor.

3. The memory structure of claim 1, wherein the first extension portion is in contact with a sidewall of the isolation structure.

4. The memory structure of claim 1, wherein the first extension portion is not in contact with a sidewall of the isolation structure.

5. The memory structure of claim 1, wherein the second extension portion is in contact with a sidewall of the isolation structure.

6. The memory structure of claim 1, wherein the second extension portion is not in contact with a sidewall of the isolation structure.

7. The memory structure of claim 1, wherein the bottom electrode of the first extension portion is connected to the source/drain region of the first transistor.

8. The memory structure of claim 1, wherein the bottom electrode of the second extension portion is connected to the source/drain region of the second transistor.

9. The memory structure of claim 1, further comprising a protection layer disposed on sidewalls of a gate structure of the first transistor and sidewalls of a gate structure of the second transistor.

10. A manufacturing method of a memory structure, comprising:
   forming an isolation structure in a substrate;
   forming a first transistor and a second transistor on the substrate, wherein the first transistor and the second transistor are respectively located at both sides of the isolation structure; and
   forming a capacitor between the first transistor and the second transistor, wherein the capacitor comprises:
      a body portion, disposed above the isolation structure;
      a first extension portion, extending from the body portion into the substrate at one side of the isolation structure and connected to a source/drain region of the first transistor; and
      a second extension portion, extending from the body portion into the substrate at another side of the isolation structure and connected to a source/drain region of the second transistor,
   wherein a width of the first extension portion and a width of the second extension portion are decreased downward from a top surface of the isolation structure,
   wherein a method for forming the capacitor comprises:
   forming a first trench and a second trench respectively in the substrate at both sides of the isolation structure, wherein a width of the first trench and a width of the second trench are decreased downward from the top surface of the isolation structure;
   forming a dielectric layer on the substrate, wherein the dielectric layer covers a first gate structure of the first transistor and a second gate structure of the second transistor and fills the first trench and the second trench;
   forming a third trench in the dielectric layer, wherein the third trench exposes the isolation structure, the first trench, the second trench and at least a part of the source/drain region of the first transistor and at least a part of the source/drain region of the second transistor respectively located at both sides of the isolation structure;
   forming a bottom electrode on a sidewall and a bottom surface of the first trench, a sidewall and a bottom surface of the second trench, a sidewall and a bottom surface of the third trench and an exposed surface of the isolation structure;
   forming an insulation layer on the bottom electrode; and
   forming a top electrode on the insulation layer.

11. The manufacturing method of claim 10, wherein the substrate is a silicon substrate, a top surface of the substrate is a {100} plane, and a method for forming the first trench and the second trench comprises:
   forming a patterned mask layer on the substrate, wherein the patterned mask layer exposes a region comprising the isolation structure and the substrate at both sides of the isolation structure; and
   performing a wet etching process to remove a part of the substrate at both sides of the isolation structure,
   wherein a surface of the substrate exposed by the first trench is a {111} plane, and a surface of the substrate exposed by the second trench is a {111} plane, and
   wherein an angle between the surface of the substrate exposed by the first trench and the top surface of the substrate is between 50 degrees and 60 degrees, and an angle between the surface of the substrate exposed by the second trench and the top surface of the substrate is between 50 degrees and 60 degrees.

12. The manufacturing method of claim 11, wherein an etchant used in the wet etching process comprises KOH, tetra ethyl ammonium hydroxide or ethylene diamine pyrochatecol.

13. The manufacturing method of claim 10, wherein a method for forming the first transistor and the second transistor comprises:
   forming a first gate structure and a second gate structure on the substrate before forming the first trench and the second trench; and
   forming the source/drain region of the first transistor in the substrate beside the first gate structure, and forming the source/drain region of the second transistor in the substrate beside the second gate structure after forming the first trench and the second trench.

14. The manufacturing method of claim 10, further comprising:
   forming a protection layer conformally on the substrate before forming the first trench and the second trench; and
   removing a part of the protection layer to retain the protection layer on the sidewall of the gate structure of the first transistor and the sidewall of the gate structure of the second transistor after forming the first trench and the second trench and before forming the dielectric layer.

15. The manufacturing method of claim 10, wherein the first extension portion is in contact with a sidewall of the isolation structure.

16. The manufacturing method of claim 10, wherein the first extension portion is not in contact with a sidewall of the isolation structure.

17. The manufacturing method of claim 10, wherein the second extension portion is in contact with a sidewall of the isolation structure.

18. The manufacturing method of claim 10, wherein the second extension portion is not in contact with a sidewall of the isolation structure.

* * * * *